United States Patent
Chang et al.

(10) Patent No.: US 6,853,202 B1
(45) Date of Patent: Feb. 8, 2005

(54) NON-STICK DETECTION METHOD AND MECHANISM FOR ARRAY MOLDED LAMINATE PACKAGES

(75) Inventors: Bo Chang, Cupertino, CA (US); Vani Verma, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 14 days.

(21) Appl. No.: 10/056,242

(22) Filed: Jan. 23, 2002

(51) Int. Cl.[7] .......................... G01R 27/08; G01R 31/26
(52) U.S. Cl. ..................... 324/691; 324/763; 324/765; 438/15; 438/17
(58) Field of Search .............................. 324/691, 713, 324/763, 765; 438/14, 15, 17, 18

(56) References Cited

U.S. PATENT DOCUMENTS

| | | | | |
|---|---|---|---|---|
| 4,812,742 A | * | 3/1989 | Abel et al. .................. | 324/537 |
| 5,777,381 A | * | 7/1998 | Nishida ....................... | 257/693 |
| 6,117,693 A | * | 9/2000 | Fogal et al. .................. | 438/14 |
| 6,326,244 B1 | * | 12/2001 | Brooks et al. ............... | 438/124 |
| 6,566,168 B2 | * | 5/2003 | Gang .......................... | 438/112 |

* cited by examiner

Primary Examiner—N. Le
Assistant Examiner—Donald M Lair
(74) Attorney, Agent, or Firm—Wagner, Murabito & Hao LLP

(57) ABSTRACT

Embodiments of the present invention relate to a method and mechanism for testing wire bonds in an integrated circuit package. The method comprises bonding an integrated circuit silicon die to a package substrate. Next, wire connections are formed between pads in the integrated circuit silicon die and contact leads in the package substrate and testing each of the wire connections in order to detect non-stick failures using electrical continuity provided by the integrated circuit silicon die substrate. Electrical continuity is provided through dedicated pads in the package substrate that contact the underside of the silicon die substrate. The dedicated contact pads in each package substrate of the molded laminate array are connected to each other and to the mold gate. The continuity thus provided allows a non-stick-on-pad test by ensuring continuity between the wire spool through the die to the mold gate. Non-stick-on-lead check then looks for an open circuit between the wire spool and the mold gate which indicates a successful wire bond to the lead and associated separation from the wire feed capillary. The IC contact pads and leads in the package substrate are electrically isolated in order to allow functional testing and burn-in while the packaged integrated circuits are still in the laminate substrate array.

11 Claims, 6 Drawing Sheets

NON-STICK DETECTION METHOD AND MECHANISM FOR ARRAY MOLDED LAMINATE PACKAGES

FIELD OF THE INVENTION

Embodiments of the present invention relate to the field of integrated circuit packaging and testing.

BACKGROUND OF THE INVENTION

Manufacturing methods for integrated circuits have kept apace of, and in many cases enable, developments in the integrated circuits themselves. The ever smaller feature architecture within IC's has been accompanied by the technology that allows ever smaller packaging of the IC chips. Size, time and cost of IC production have all continued to shrink at tremendous rates.

Testing techniques associated with the various stages of IC packaging has been pressed to keep up with developments in the other areas of production. As new methods of connecting IC's into the surrounding electronic world have emerged, some older testing regimens have been a restriction on some developments.

Among the many packaging techniques that has emerged in recent years is the ball grid array (BGA). An improvement on earlier surface mount technology, BGA has allowed orders of magnitude improvements in speed, miniaturization and reliability of packaged IC's.

In BGA packaging, the array of solder pads that lends the name to the technique are typically mounted on one surface of a tiny printed circuit board (PCB), not much larger than the IC die itself, and made of a very thin substrate. The IC die is bonded and wired to connections on the opposite side of the small PCB using microscopic connections.

Typically, the small BGA PCB's are constructed in relatively large, array molded, laminate substrate sheets. By obviating the need for the long lead fingers of the prior lead frame array associated with previous surface mount technology, BGA packaging allows relatively dense arrays of units in process. The IC's are each bonded to the appropriate positions on the laminate substrate while the small BGA PCB's are still attached to each other. After bonding the dies to the substrate traces and testing the connections, the sheets are generally separated into individual units for functional testing.

Commonly, in this process in which multiple BGA units occupy the same laminate substrate strip, the individual traces on each of the units are connected to a common bus line (109, FIG. 1A) in order to allow an electrolytic plating process for Gold/Nickel plating, in an electro-plated substrate. These bus lines are eventually connected to the mold gate. This is called a "standard bus design" type packaging substrate.

During wire-bonding of such substrates, wire non-stick-on-pad (NSOP) and non-stick-on-lead (NSOL) conditions can be detected to avoid wire bond failures in assembly. This is done by using the electrical circuit as shown in conventional art FIG. 1A. The bus enabled circuit is formed after bonding IC 102 to BGA substrate 101 and wire-bonding first wire connection 106. The circuit closure is made through the gold wire in the spool, 105, the wire on the bond pad 106, to the lead finger 107 using the first wirebond 108, to bus-line 109 from lead fingers and finally to the mold gate 110.

The mold gate is grounded to the wire bond clamp. Using this circuit, if there is a bad bond on either the bond pad or lead finger, the circuit is affected, and the bond's quality can be easily measured electrically. Similar technology is used in leadframe based assembly, where the die attach pad is grounded to the wire bond clamp, through the leadframe, and is used for Non stick detection (NSD).

Since all the individual IC dies in a standard bus design substrate are connected electrically to each other via the bus lines, they cannot be tested, or burnt-in, in strip form and must be separated before being handled and tested as individual units. Also, since the first circuit is not completed until the first bond is completed on both ball pad side and lead finger side, the first ball bond NSOP detection has to be skipped in the wire-bond test step. For all successive bonds, this first bond serves as the electrical connection between the silicon and the lead fingers for grounding to the mold gate. If a no-bus type substrate design is used, in order to allow for in-strip testing, there is no NSO capability since the electrical circuit is not completed back to the mold gate in the absence of the bus-line connection. Conventional Art FIG. 1B illustrates a no-bus design. Lead fingers 107 are isolated from each other and from mold gate grounding 110. The result is an open circuit 105 and an inability to check for proper sticking in connection wire 106.

The current art, then, is disadvantageous because the prevalent and method of NSD requires that lead fingers be grounded which prohibits in-strip functional testing and burn-in of the packaged ICs.

SUMMARY OF THE INVENTION

Presented herein is a method for performing non-stick detection in a BGA packaging substrate array strip that does not require a bus connecting all leads and pads together. Furthermore, the testing method allows the assembled BGA packages to be functionally tested while still in the array strip.

More specifically, embodiments of the present invention relate to a method and mechanism for testing wire bonds in an integrated circuit package. The method comprises bonding an integrated circuit silicon die to a package substrate. Next, wire connections are formed between pads in the integrated circuit silicon die and contact leads in the package substrate and testing each of the wire connections in order to detect non-stick failures using electrical continuity provided by the integrated circuit silicon die substrate. Electrical continuity is provided through dedicated pads in the package substrate that contact the underside of the silicon die substrate. The dedicated contact pads in each package substrate of the molded laminate array are connected to each other and to the mold gate. The continuity thus provided allows a non-stick-on-pad test by ensuring continuity between the wire spool through the die to the mold gate. Non-stick-on-lead check then looks for an open circuit between the wire spool and the mold gate which indicates a successful wire bond to the lead and associated separation from the wire feed capillary. The IC contact pads and leads in the package substrate are electrically isolated in order to allow functional testing and burn-in while the packaged integrated circuits are still in the laminate substrate array.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

Conventional Art

Conventional Art

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention. At times, concepts disclosed in this embodiment of the present invention will be made more readily apparent be reference to the Figures.

Embodiments of the present invention discussed herein relate to testing methods in the packaging process of integrated circuit production. In this embodiment, the electrical path for testing the wire bonding of each unit is completed through the die backside, connecting to a special metal pad under the die, to be used only for NSD. In this implementation, the die backside is grounded to a special NSD trace on the substrate die paddle area. This trace metal land is not covered by the solder mask coating, so that there is electrical contact between the die backside and this trace land via the conductive die attach material. Note that, being uncoated, the metal land is easily etched back subsequent to NSD.

These special NSD traces are connected to a bus line and shorted back to the mold gate. The traces can be connected to the bus line used for plating the lead fingers or an additional bus line. These bus lines can be on either the top or bottom metal layer of the substrate. In case of connection using the bottom metal layer, the traces are connected to traces on the bottom of the substrate using drilled and plated vias. The bus-lines on the bottom layer are then connected back to the mold gate on the top layer using another plated through hole via under the mold gate.

Figure 1A:
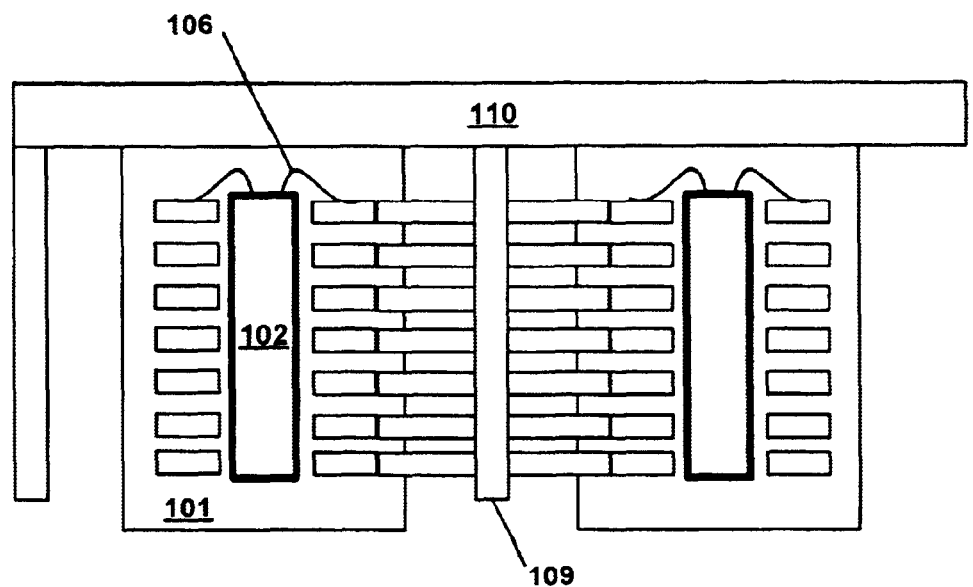
FIG. 1A illustrates conventional NSD testing in a bus-connected array.
Figure 1A:
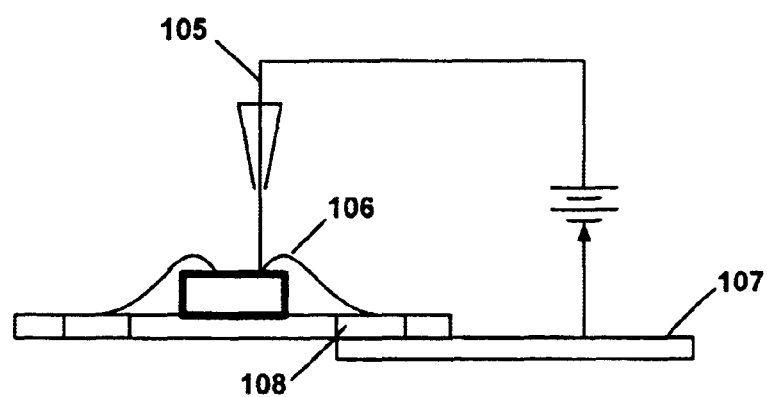
Figure 1B:
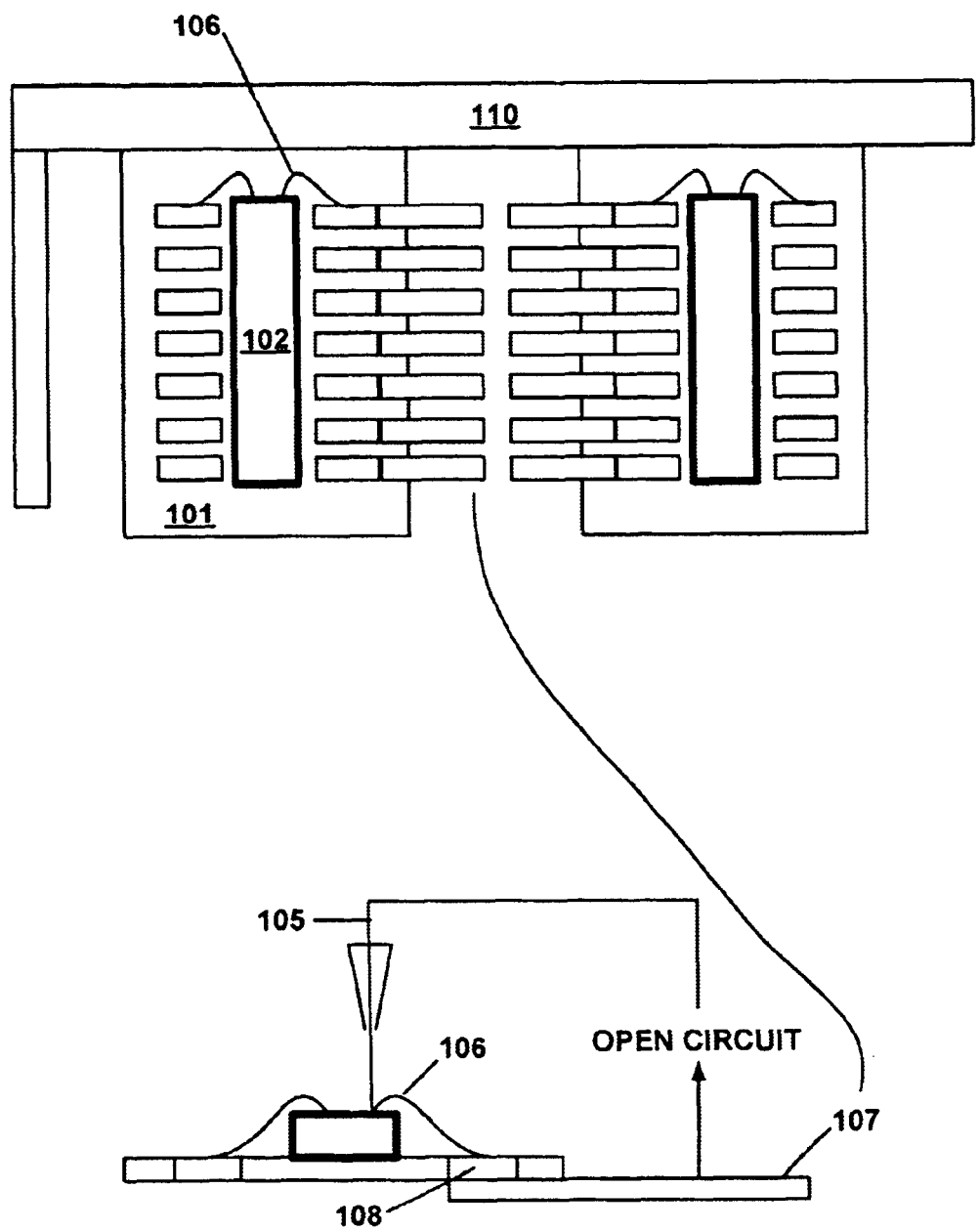
FIG. 1B illustrates a failure of conventional NSD testing in a non-bus-connected array.
Figure 2:
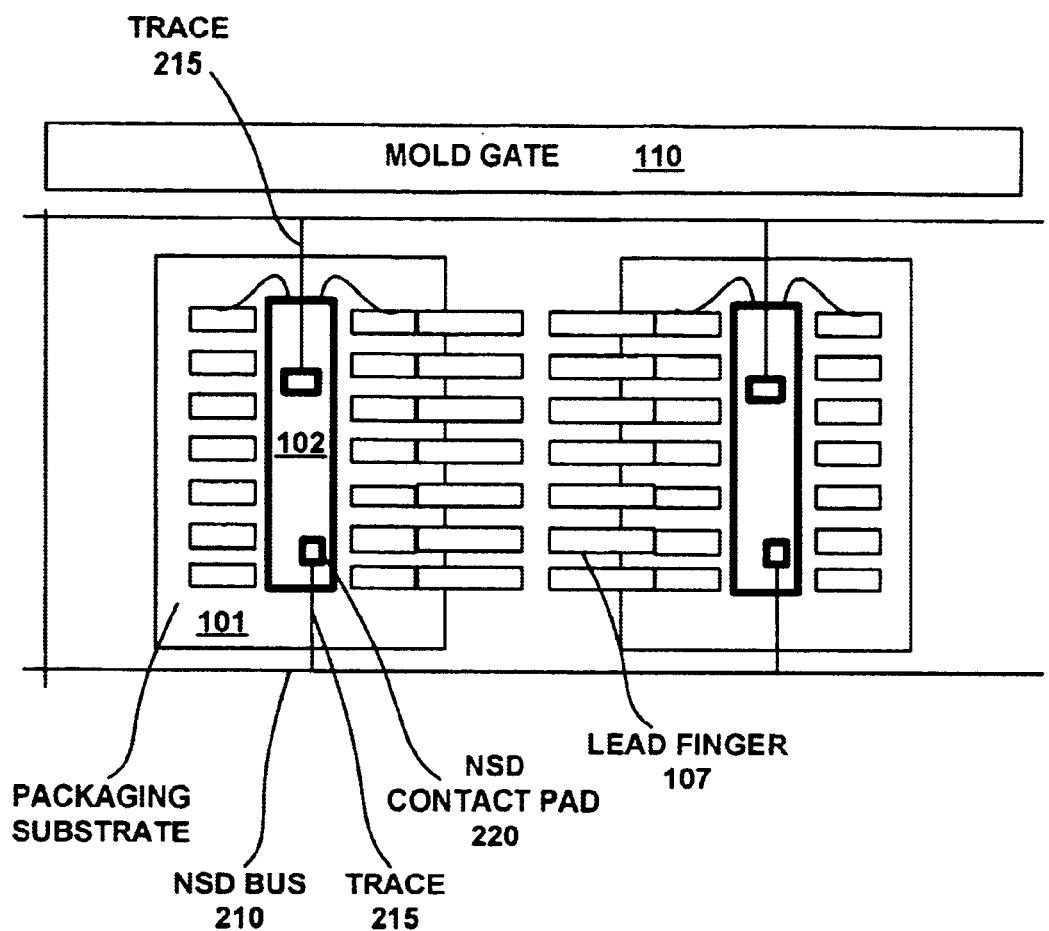
FIG. 2 illustrates array molded laminate substrates with NSD pad and bus in accordance with one embodiment of the present invention.

FIG. 2 illustrates a possible location for the dedicated NSD contact pads 220 in packaging substrates in a molded laminate array. Dedicated pads 220 are shown connected by traces 215 to NSD bus 210. Bus 210 connects NSD pads in other substrates in the substrate array as well. Note specifically that lead fingers 107 are not connected to each other nor to mold gate bus 110, making FIG. 2 an illustration of a no-bus design array.

In the case of a "bus design," there can be two sets of bus lines, one used in the electrolytic plating of traces connected to the lead fingers, and another for bus-connecting the special NSD traces under the die. This allows selectively etching back the lead finger plating bus lines, without etching back the NSD trace bus line, to subsequently achieve a "no-bus" design.

In both bus and no-bus cases, this embodiment of the present invention allows a first ball bond NSD since the electrical circuit is complete through the gold wire in spool, the wire in the capillary, the die silicon, the electrically conductive die attach material, the non-stick detection trace under die, the bus line and, finally, the mold gate, which is grounded.

Figure 3:
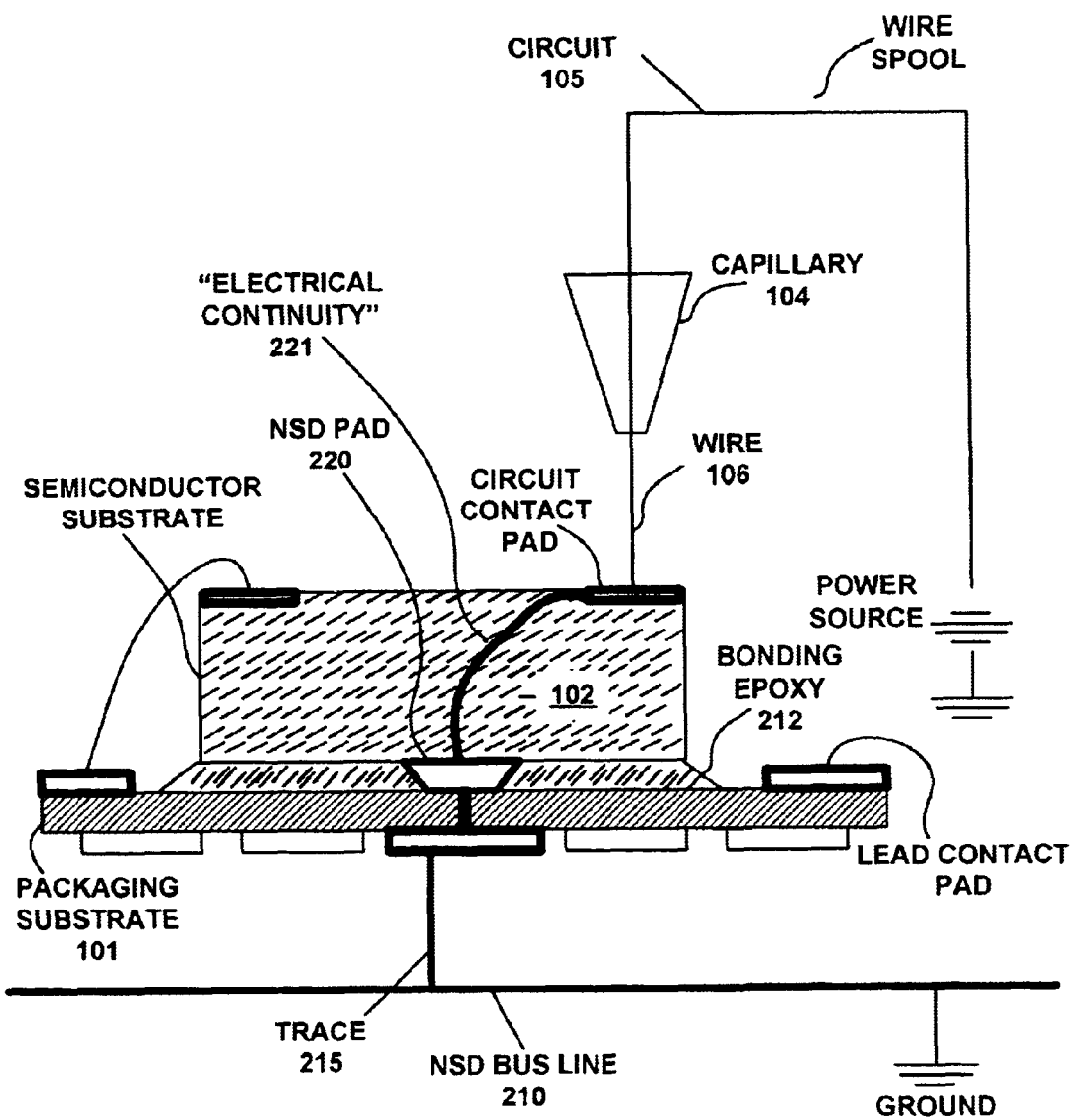
FIG. 3 illustrates non-stick on pad (NSOP) detection in accordance with one embodiment of the present invention.

The circuit connection for NSD is illustrated in FIG. 3. Here, test circuit 105 is shown completed during NSOP testing. Wire bond 106 has been attached to a pad on IC die 102 which is bonded using bonding epoxy 212 to packaging substrate 101. Continuity to dedicated NSD pad 220 through the substrate silicon of die 102 is shown at 221. NSD pad 220 is connected via a trace 215 in a routing layer in substrate 101 to NSD bus line 210 and then to ground. Non-stick would be indicated by an open circuit 105.

Figure 4:
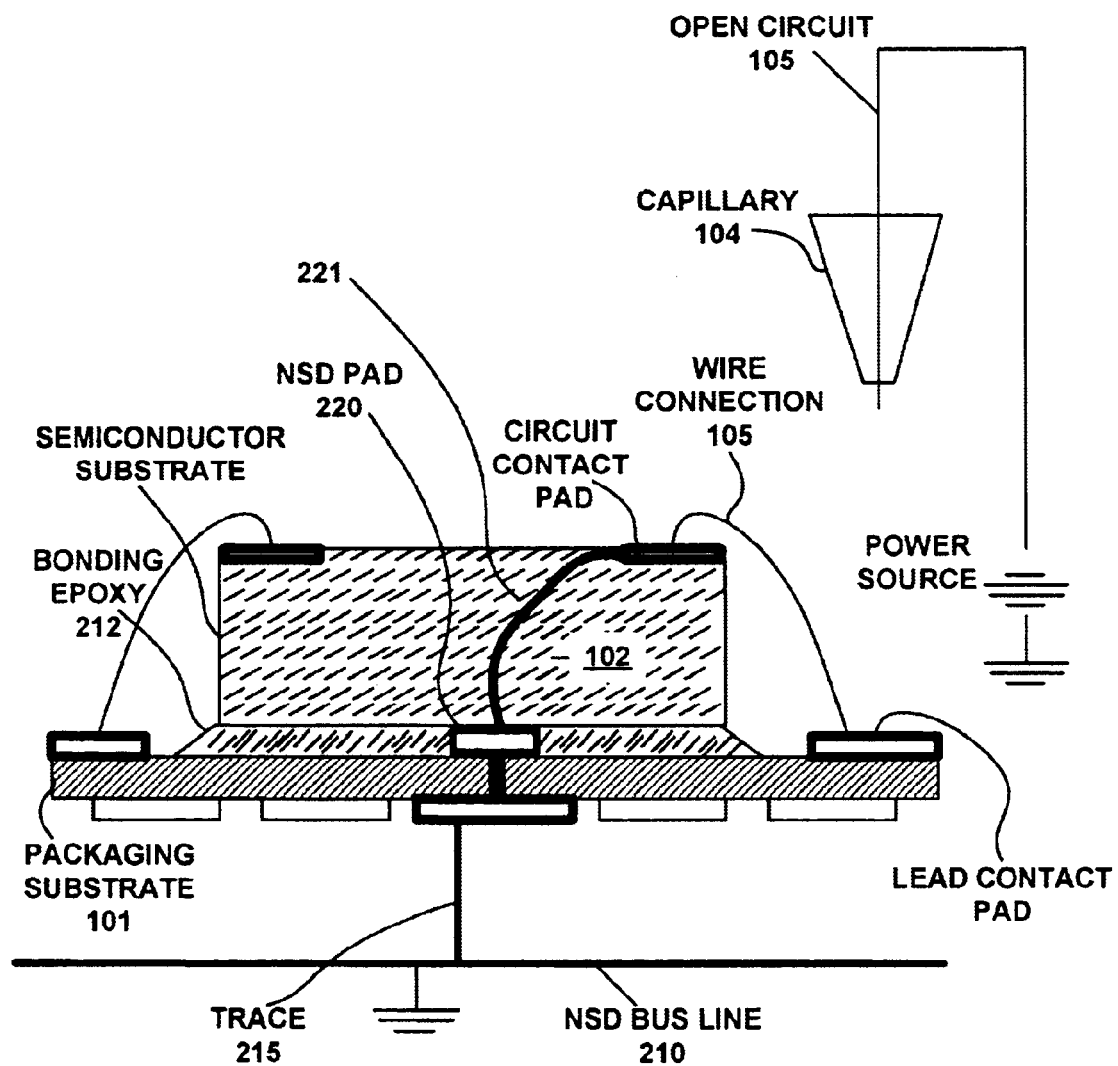
FIG. 4 illustrates non-stick on lead (NSOL) detection in accordance with one embodiment of the present invention.

Similarly, FIG. 4 illustrates NSOL testing. Here testing indicates a stick failure when circuit 105 is completed through the bonding wire. Wire bonds are made, in this embodiment, by attaching the die pad end first, checking NSOP, then bonding the lead end. A successful bonding results in separation of the wire from the wire feed capillary 104. If the wire bonding fails to stick to the lead contact pad, then that failure is indicated by circuit 105 remaining closed. A successful stick would be indicated by an open circuit.

In this implementation of this embodiment of the present invention there are two of the dedicated NSD traces on each die attach area, both connected to the bus lines and to each other. This could allow an electrical path between bus lines of adjacent die paddle units; even when the die is absent. Since substrate production typically produces less than 100% yields, it is common to get some reject spots on the substrate where a die attachment is skipped. If the two traces are not connected to each other, then a conductive path through the die attach material between them would be necessary.

Implementations of this embodiment of the present invention can also support NSD in processes using nonconductive die attach paste. In such a case, an implementation could be modified in the following manner. Any one of the lead fingers of each die paddle unit can be shorted and grounded to the mold gate, the lead finger to be used being selected based on the functionality of that lead finger. A common choice would be a ground pin finger.

During wire bonding, the first ball bond NSOP test would initially be skipped and the first wire bond to the grounded lead finger would be used as the electrical circuit completion for NSD of all the other wires, the continuity for which would an ohmic connection through the die material. This implementation would allow for etch-back of substrates in applications that use non-conductive die attach material as well. A wire bonder could be programmed to return to and check the first ball-bond NSOP at a later stage in the process. In most cases the ground pin lead finger can be used as the pin shorted to the mold gate for NSD.

This embodiment of the present invention allows true NSD for both NSOP and NSOL on all BGA packages, irrespective of the plating bus bar design, or fabrication methods, for every wire bond. This embodiment enables the capability of testing BGA units in strip form, as well as burn-in of the units in strip form. The cost and time savings of enabling bulk handling in these processes while still attached in strip form should be readily apparent. The savings would include reducing the test and burn-in costs by eliminating package-dimension-specific test sockets, burn-in sockets and boards. Process cycle time as well as costs related to package changeover can be eliminated using this embodiment.

Plastic BGA packages, in larger package sizes, can use a gold plated die attach paddle under the die as a grounding for NSD in this embodiment. However this is possible only if routing for the BGA contact pads does not use this space. Smaller BGA's, often referred to as Fine pitch BGA (FBGA) use the area under the die for trace routing and a die attach paddle implementation must take routing into account.

Figure 5:
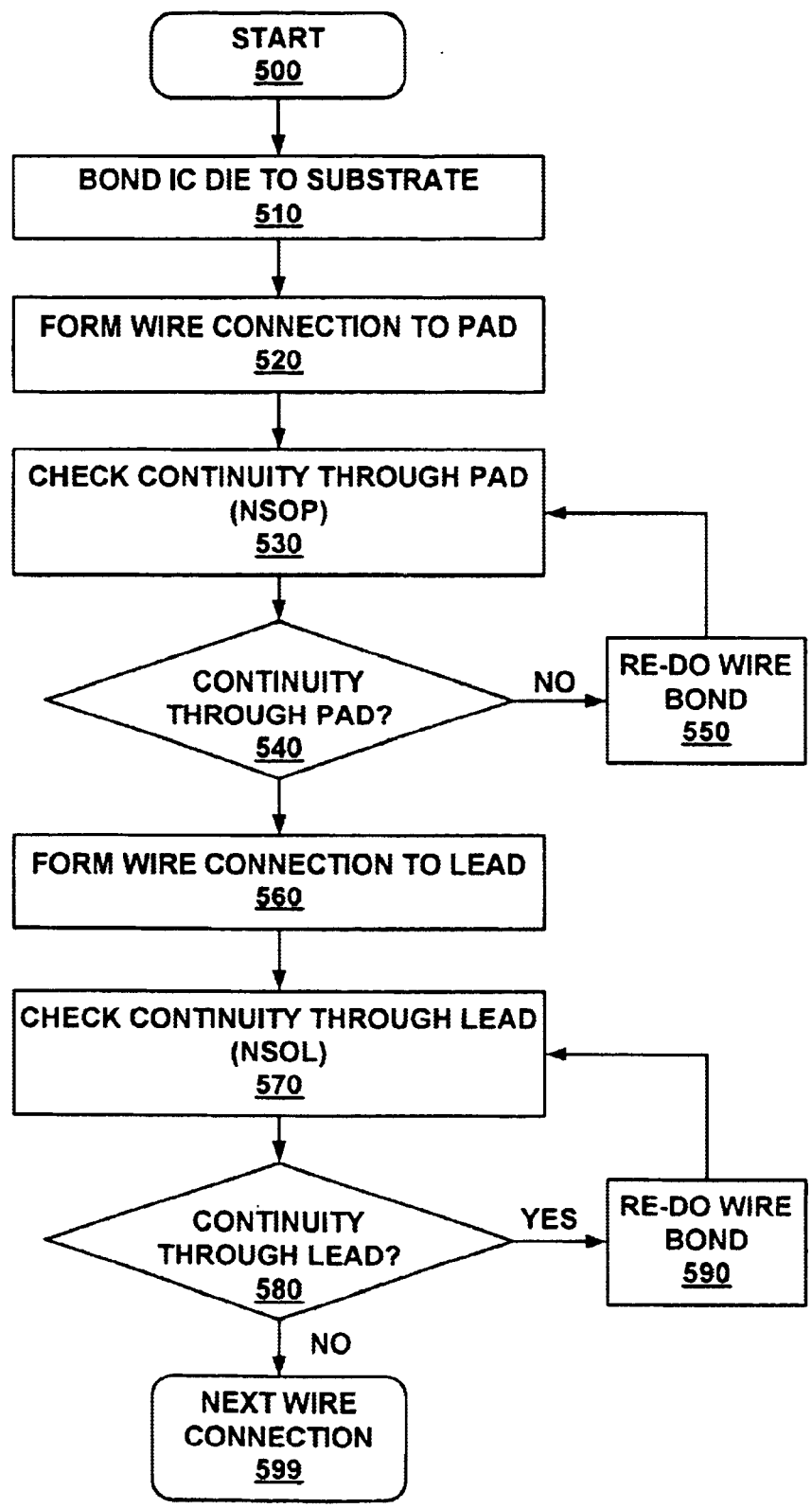
FIG. 5 illustrates a non-stick detection method in flowchart form.

FIG. 5 illustrates the NSD method described herein in flowchart form. Method 500 starts by bonding the IC die to the packaging substrate, 510, then commencing the formation of wire bonding, 520. After bonding the connection wire to the IC's circuit contact pad, electrical continuity is checked, 530, from the wire spool through the wire feed capillary, the circuit contact pad, the IC die's silicon substrate, the dedicated NSD contact pads on the packaging substrate, the grounding line traces to the mold gate. If continuity does not exist 540 then a non-stick failure is assumed and the bond is redone, 550. If continuity does exist, there is no non-stick failure. The wire is then bonded at the lead contact pad on the packaging substrate, 560, and, if properly bonded, separates from the wire feed capillary. Then another continuity check is made, 570. If there is continuity at this point, 580, then the wire has failed to stick and a non-stick-on-lead failure is detected. The bond is reattempted, 590. If there is no continuity, then a non-stick is not detected and the process moves on, 599.

A new method for implementing non-stick detection for array-molded laminate packages without a plating bus has been described. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method for testing wire bonds in an integrated circuit package, comprising:

receiving a die comprising an integrated circuit formed on a semiconductor substrate that is bonded to a packaging substrate, said integrated circuit comprising a circuit contact pad and said packaging substrate comprising a lead contact pad, wherein a non-stick detection (NSD) contact pad contacts said semiconductor substrate and extends through said packaging substrate, said NSD contact pad coupled via a trace line to a bus line that is coupled to ground;

forming a wire connection between said circuit contact pad and said lead contact pad; and testing said wire connection for failure to stick at said circuit contact pad and at said lead contact pad by checking for electrical continuity along a path comprising said circuit contact pad and said NSD contact pad, wherein said semiconductor substrate itself provides electrical continuity between said circuit contact pad and said NSD contact pad for said testing.

2. A method as described in claim 1, wherein said integrated circuit die is bonded to said packaging substrate using electrically conductive epoxy.

3. A method as described in claim 1, wherein said integrated circuit die is bonded to said packaging substrate using non-electrically conductive epoxy.

4. A method as described in claim 1, wherein said lead contact pad is electrically isolated from other lead contact pads in said packaging substrate.

5. A method as described in claim 1, wherein said method is performed for a plurality of wire connections.

6. A method for testing wire bonds in an integrated circuit package, comprising:

receiving a die comprising an integrated circuit formed on a semiconductor substrate, wherein said integrated circuit die is bonded to a packaging substrate;

connecting one end of a wire to a circuit contact pad of said integrated circuit; and testing for failure of said wire to stick to said circuit contact pad by checking for electrical continuity along a path comprising said circuit contact pad and a non-stick detection (NSD) contact pad coupled to said semiconductor substrate, wherein said NSD contact pad extends through said packaging substrate and wherein said semiconductor substrate provides electrical continuity between said circuit contact pad and said NSD contact pad for said testing.

7. A method as described in claim 6, wherein said NSD contact pad is coupled via a trace line to a bus line that is coupled to a grounded mold gate, wherein said path for checking electrical continuity further comprises said trace line, said bus line and said mold gate.

8. The method of claim 7, wherein said wire is fed from a wire spool and wherein said path for checking electrical continuity further comprises said wire and said wire spool.

9. A method for testing wire bonds in an integrated circuit package, comprising:

connecting the first end of a length of a wire fed from a wire spool to a circuit contact pad in an integrated circuit formed on a semiconductor substrate that is bonded to a packaging substrate; and testing said connecting of said first end of said wire to said circuit contact pad for failure to stick by checking for electrical continuity on a path comprising, in order, said wire spool, said length of wire, said circuit contact pad, said semiconductor substrate, and a non-stick detection (NSD) contact pad coupled to said semiconductor substrate, wherein said NSD contact pad extends through said packaging substrate, wherein said semiconductor substrate provides electrical continuity between said circuit contact pad and said NSD contact pad for said testing, wherein failure to stick at said first end is indicated if said electrical continuity does not exist.

10. A method as described in claim 9 wherein said NSD contact pad is coupled via a trace line to a bus line that is coupled to a grounded mold gate, wherein said path for checking electrical continuity further comprises said trace line, said bus line and said mold gate.

11. A method as described in claim 9, further comprising:

connecting the second end of said length of wire to a lead contact pad in said packaging substrate, wherein successful connection of said second end to said lead contact pad causes said length of wire to separate from said wire spool; and testing connection of said second end to said lead contact pad for failure to stick by checking for electrical continuity along said path, wherein failure to stick at said second end is indicated if electrical continuity exists.

* * * * *